(12) United States Patent
Arakawa

(10) Patent No.: US 9,979,185 B2
(45) Date of Patent: May 22, 2018

(54) ELECTROSTATIC PROTECTION CIRCUIT AND INTEGRATED CIRCUIT

(71) Applicant: SOCIONEXT INC., Yokohama-shi, Kanagawa (JP)

(72) Inventor: Masahito Arakawa, Fuchu (JP)

(73) Assignee: SOCIONEXT INC., Yokohama (JP)

( * ) Notice: Subject to any disclaimer, the term of this patent is extended or adjusted under 35 U.S.C. 154(b) by 245 days.

(21) Appl. No.: 14/837,927

(22) Filed: Aug. 27, 2015

(65) Prior Publication Data

US 2016/0079225 A1    Mar. 17, 2016

(30) Foreign Application Priority Data

Sep. 17, 2014    (JP) .................................. 2014-188813

(51) Int. Cl.
*H02H 9/04*    (2006.01)
*H01L 27/02*    (2006.01)

(52) U.S. Cl.
CPC ......... *H02H 9/046* (2013.01); *H01L 27/0285* (2013.01)

(58) Field of Classification Search
CPC .............................. H02H 9/046; H01L 27/0285
See application file for complete search history.

(56) References Cited

U.S. PATENT DOCUMENTS

| | | | |
|---|---|---|---|
| 5,821,797 A * | 10/1998 | Kinugasa | ............ H01L 27/0251 257/355 |
| 6,580,592 B2 | 6/2003 | Kato | |
| 6,781,805 B1 | 8/2004 | Urakawa | |
| 2003/0016478 A1* | 1/2003 | Liu | ...................... H01L 27/0266 361/56 |
| 2010/0265622 A1* | 10/2010 | Campi, Jr. | .......... H01L 27/0274 361/56 |

FOREIGN PATENT DOCUMENTS

| | | |
|---|---|---|
| JP | 2001-160615 A | 6/2001 |
| JP | 2002-141467 A | 5/2002 |
| JP | 2007-214420 A | 8/2007 |

* cited by examiner

*Primary Examiner* — Scott Bauer
(74) *Attorney, Agent, or Firm* — Arent Fox LLP

(57) ABSTRACT

An electrostatic protection circuit includes a first transistor connected to an external terminal, a second transistor that is connected in series to the first transistor and that is in a normally OFF state. The electrostatic protection circuit includes a third transistor that is connected between a power source line and a gate of the first transistor, and a fourth transistor that is connected between the power source line and the gate of the first transistor in the opposite direction to the third transistor.

20 Claims, 16 Drawing Sheets

ELECTROSTATIC PROTECTION CIRCUIT AND INTEGRATED CIRCUIT

CROSS-REFERENCE TO RELATED APPLICATION

This application is based upon and claims the benefit of priority of the prior Japanese Patent Application No. 2014-188813, filed on Sep. 17, 2014, the entire contents of which are incorporated herein by reference.

FIELD

The embodiments discussed herein are related to an electrostatic protection circuit and an integrated circuit.

BACKGROUND

The following technology is, for example, known in relation to electrostatic protection circuits that protect semiconductor devices from electrostatic discharge (ESD).

Namely, an electrostatic discharge protection circuit is known that includes a first NMOS transistor and a second NMOS transistor that are inserted between an external connection pad and a ground connection line and connected together in series, a first gate potential control circuit, and a second gate potential control circuit. The first gate potential control circuit is connected to the gate of the first NMOS transistor, includes a capacitor element, sets the gate potential of the first NMOS transistor to the same potential as a power source line during normal operation, and makes the gate potential of the first NMOS transistor effectively the same as ground level when an electrostatic surge occurs. The second gate potential control circuit is connected to the gate of the second NMOS transistor, and makes the gate potential of the second NMOS transistor ground level during normal operation.

Another known semiconductor device includes a first MOS transistor connected between an input line and an internal node, and a second MOS transistor that is connected between a second power source line and the internal node, and that has a gate electrode connected to the second power source line. This semiconductor device further includes a circuit element that is provided between a first power source line and the gate electrode of the first MOS transistor, and that is capable of applying a control voltage when the first MOS transistor enters a normally ON state.

A stacked MOS transistor protection circuit is also known that is provided with first and second MOS transistors that have the source of the first MOS transistor and the drain of the second MOS transistors connected together. The stacked MOS transistor protection circuit includes a diode serving as a clamper circuit with a cathode connected to the gate of the first MOS transistor and an anode connected to the drain of the first MOS transistor.

RELATED PATENT DOCUMENTS

Japanese Patent Application Laid-Open (JP-A) No. 2007-214420
JP-A No. 2002-141467
JP-A No. 2001-160615

SUMMARY

According to an aspect of the embodiments, an electrostatic protection circuit includes: a first transistor connected to an external terminal; a second transistor that is connected in series to the first transistor and that is normally in an OFF state; a third transistor that is connected between a power source line and a gate of the first transistor; and a fourth transistor that is connected between the power source line and the gate of the first transistor in a direction opposite to a direction of the third transistor.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
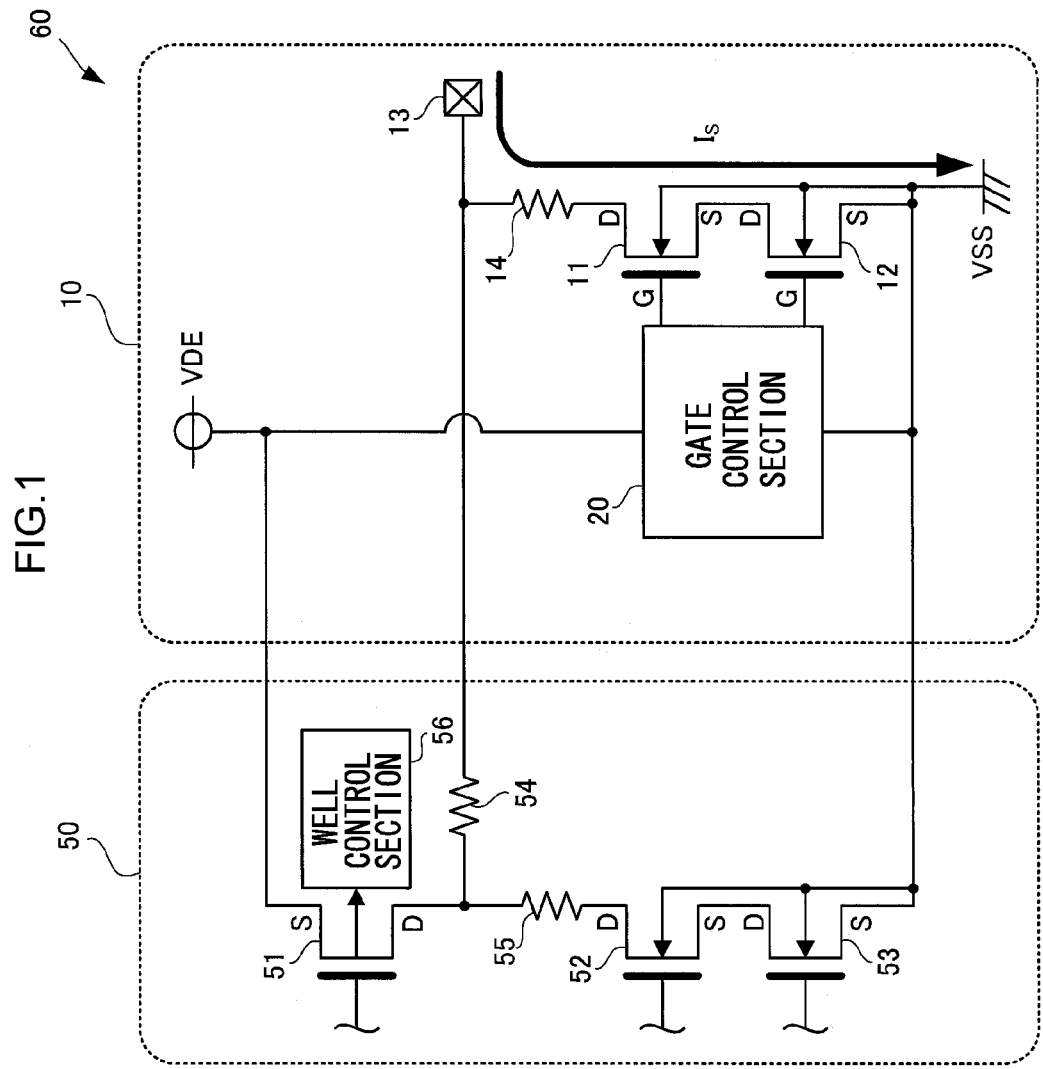
FIG. 1 is a diagram illustrating a configuration of an integrated circuit according to an exemplary embodiment of technology disclosed herein.

A tolerant circuit is a circuit with a circuit design that permits input exceeding a standard operation voltage of a transistor. For example, a 5V tolerant circuit is configured using a transistor that permits an input voltage of up to 3.3V, and has a circuit configuration with 5V as the permissible input voltage.

An electrostatic protection circuit having a tolerant circuit as the protection target may, for example, be configured including two transistors connected together in series, due to needing to possess tolerant functionality itself. The transistor on the high potential side of the two transistors is connected to an external terminal. Connecting the two transistors together in series enables the voltage applied across the terminals of each transistor to be suppressed to the permissible voltage of each transistor, or less, even if a voltage (for example, 5V) exceeding the permissible voltage of each transistor (for example, 3.3V) is input to the external terminal.

In electrostatic protection circuits including two transistors connected together in series, maintaining the gate voltage of the high potential side transistor, which rises as an ESD surge is applied, is effective as a method to raise the discharge capability to ESD surge applied to the external terminal. However, in such cases the gate voltage of the transistor on the high potential side also rises in cases in which a successive pulse signal (AC signal) is input to the external terminal during normal operation, with there being a concern that the permissible voltage might be exceeded.

Explanation follows regarding an example of an exemplary embodiment of technology disclosed herein, with reference to the drawings. In each of the drawings, the same reference numerals are appended to configuration elements and parts that are the same as, or equivalent to, each other.

First Exemplary Embodiment

FIG. 1 is a diagram illustrating a configuration of an integrated circuit 60 according to an exemplary embodiment of technology disclosed herein. The integrated circuit 60 includes an electrostatic protection circuit 10 and a protected circuit 50 to be protected from ESD surge by the electrostatic protection circuit 10. The integrated circuit 60 is, for example, formed on a semiconductor chip.

The protected circuit 50 is a circuit including tolerance functionality configured to exhibit the primary functions of the integrated circuit 60. The protected circuit 50 includes, as an example, a P-MOS transistor 51 having a source connected to a power source line VDE, and an N-MOS transistor 52 having a drain connected through a resistor element 55 to the drain of the P-MOS transistor 51. The protected circuit 50 also includes an N-MOS transistor 53 that has a drain connected to the source of the N-MOS transistor 52, and a source connected to a ground voltage line VSS. The protected circuit 50 also includes a well control section 56 that controls the potential of an n-well (not illustrated in the drawings) of the P-MOS transistor 51. The connection point between the drain of the P-MOS transistor 51 and the resistor element 55 is connected to an external input terminal 13 through a resistor element 54. Configuration is made such that the voltage applied to each of the terminals of the transistors in the protected circuit 50 does not exceed the permissible voltage, even when the input voltage supplied to the external input terminal 13 is greater than the permissible voltage of the P-MOS transistor 51 and the N-MOS transistors 52, 53. The configuration of the protected circuit 50 is not limited to that described above.

The electrostatic protection circuit 10 is a circuit that forms a discharge path when an ESD surge is applied to the external input terminal 13, and prevents a surge current $I_s$ from flowing to the protected circuit 50. The electrostatic protection circuit 10 includes an N-MOS transistor 11 having a drain connected to the external input terminal 13 through a resistor element 14. The electrostatic protection circuit 10 includes an N-MOS transistor 12 having a drain connected to the source of the N-MOS transistor 11, and a source connected to the ground voltage line VSS. Namely, the N-MOS transistor 11 and the N-MOS transistor 12 are connected together in series between the external input terminal 13 and the ground voltage line VSS.

Gates of the N-MOS transistors 11, 12 are connected to a gate control section 20. The gate control section 20 is connected between the power source line VDE and the ground voltage line VSS, and controls the gate voltages of the N-MOS transistors 11, 12. In the electrostatic protection circuit 10 according to the present exemplary embodiment, the gate of the N-MOS transistor 12 is connected to the ground voltage line VSS (see FIG. 3), and the N-MOS transistor 12 is normally in an OFF state.

Figure 2:
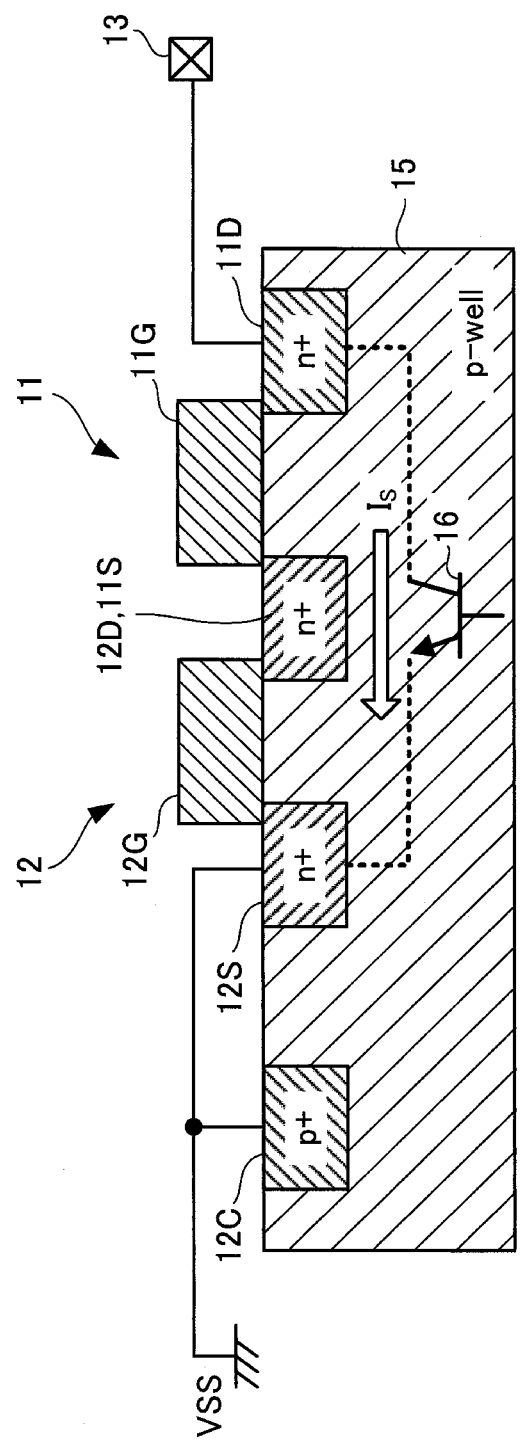
FIG. 2 is a cross-section of an N-MOS transistor configuring an electrostatic protection circuit according to an exemplary embodiment of technology disclosed herein.

FIG. 2 is a cross-section of the N-MOS transistors 11, 12 configuring the electrostatic protection circuit 10. The N-MOS transistor 11 includes an n-type drain region 11D and an n-type source region 11S formed in the surface area of a p-well region 15, and a gate electrode 11G formed between the drain region 11D and the source region 11S. Similarly, the N-MOS transistor 12 includes an n-type drain region 12D and an n-type source region 12S formed in the surface area of the p-well region 15, and a gate electrode 12G formed between the drain region 12D and the source region 12S. The N-MOS transistor 11 and the N-MOS transistor 12 share the common p-well region 15. The source region 11S of the N-MOS transistor 11 and the drain region 12D of the N-MOS transistor 12 are both formed in a common n-type region. The surface area of the p-well region 15 is formed with a p-type contact region 12C that is connected to the source region 12S of the N-MOS transistor 12 and also to the ground voltage line VSS.

When an ESD surge is applied to the external input terminal 13 of the electrostatic protection circuit 10, the electric field strength within a depletion layer on the drain region 11D side becomes large, and pairs of holes and electrons are generated. The holes migrate toward the p-well region 15 that is electrically connected to the ground voltage line VSS, and the potential of the p-well region 15 accordingly rises. A parasitic npn transistor 16 that has the drain region 11D of the N-MOS transistor 11 as a collector, the source region 12S of the N-MOS transistor 12 as an emitter, and the p-well region 15 as a base is thereby switched ON. This phenomenon is referred to as snapback. Due to the parasitic npn transistor 16 being ON, the surge current $I_s$ arising from application of the ESD surge flows from the external input terminal 13, through the N-MOS transistors 11, 12 toward the ground voltage line VSS. The resistor element 54 provided in the protected circuit 50 (see FIG. 1) prevents inflow of the surge current $I_s$ to the protected circuit 50, and substantially all of the surge current $I_s$ flows through the N-MOS transistors 11, 12 of the electrostatic protection circuit 10. The protected circuit 50 is accordingly protected from the ESD surge by the electrostatic protection circuit 10.

Figure 3:
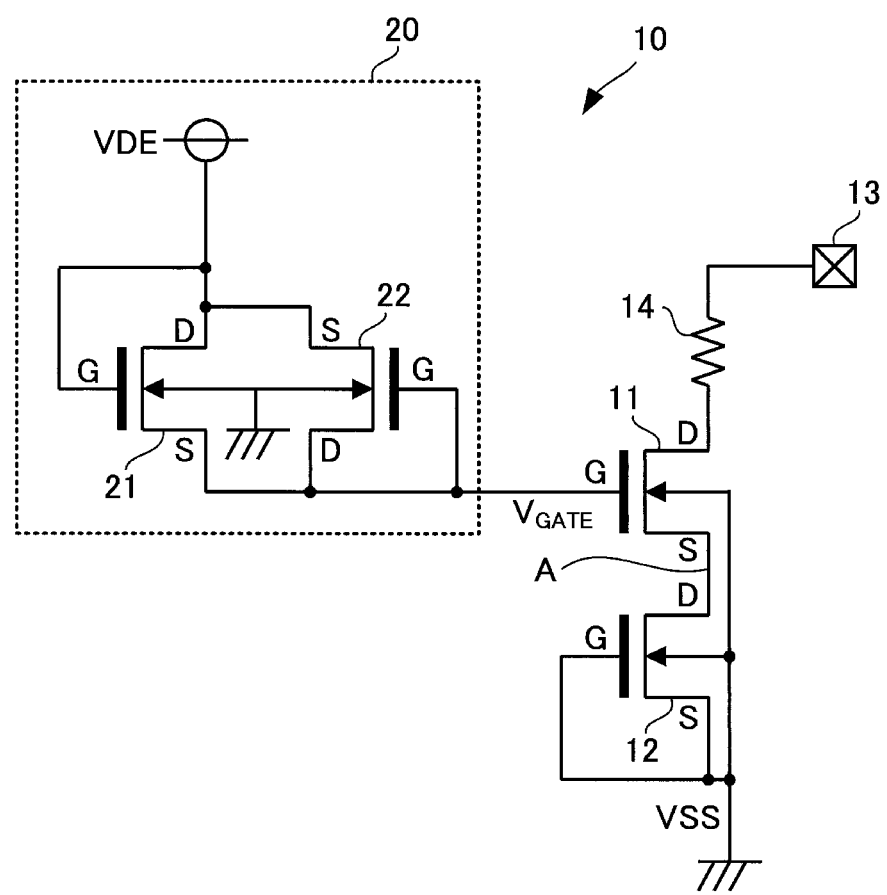
FIG. 3 is a diagram illustrating a detailed configuration of an electrostatic protection circuit according to a first exemplary embodiment of technology disclosed herein.

FIG. 3 is a diagram illustrating a detailed configuration of the electrostatic protection circuit 10 according to the first exemplary embodiment of technology disclosed herein. The protected circuit 50 is omitted from illustration in FIG. 3. The electrostatic protection circuit 10 includes two N-MOS transistors 21, 22 as the gate control section 20. The N-MOS transistor 21 has a drain and a gate connected to the power source line VDE, and a source connected to the gate of the N-MOS transistor 11. The N-MOS transistor 22 has a source connected to the power source line VDE, and a drain and a gate connected to the gate of the N-MOS transistor 11. Namely, the N-MOS transistors 21, 22 are connected together in parallel between the power source line VDE and the gate of the N-MOS transistor 11 in opposite directions to each other. The gate of the N-MOS transistor 12 is connected to the ground voltage line VSS, and the N-MOS transistor 12 is normally in an OFF state.

The electrostatic protection circuit 10 is applied with a specific voltage (for example, 3.3V) between the ground voltage line VSS and the power source line VDE during normal operation. The N-MOS transistor 21 is thereby placed in an ON state, and the voltage of the power source line VDE (3.3V) is applied to the gate of the N-MOS transistor 11. More precisely, the magnitude of the gate voltage $V_{GATE}$ of the N-MOS transistor 11 is the result of a threshold value voltage Vth of the N-MOS transistor 21 being subtracted from the voltage of the power source line VDE (3.3V). The N-MOS transistor 11 thereby enters an ON state. The N-MOS transistor 12, however, maintains an OFF state. At this time the magnitude of the potential of node A that is the connection point between the N-MOS transistor 11 and the N-MOS transistor 12 is the result of the threshold value voltage Vth of the N-MOS transistor 11 being subtracted from the gate voltage $V_{GATE}$ of the N-MOS transistor 11. Thus when the specific voltage is applied between the ground voltage line VSS and the power source line VDE, the potential of the node A is fixed at a higher potential than the potential of the ground voltage line VSS. Tolerant functionality is thereby exhibited permitting a voltage exceeding the permissible voltage of the N-MOS transistors 11 and 12 to be input to the external input terminal 13. The N-MOS transistor 12 is normally in an OFF state, and so a large current does not flow to the N-MOS transistors 11 and 12 according to application of the input value to the external input terminal 13.

Figure 4A:
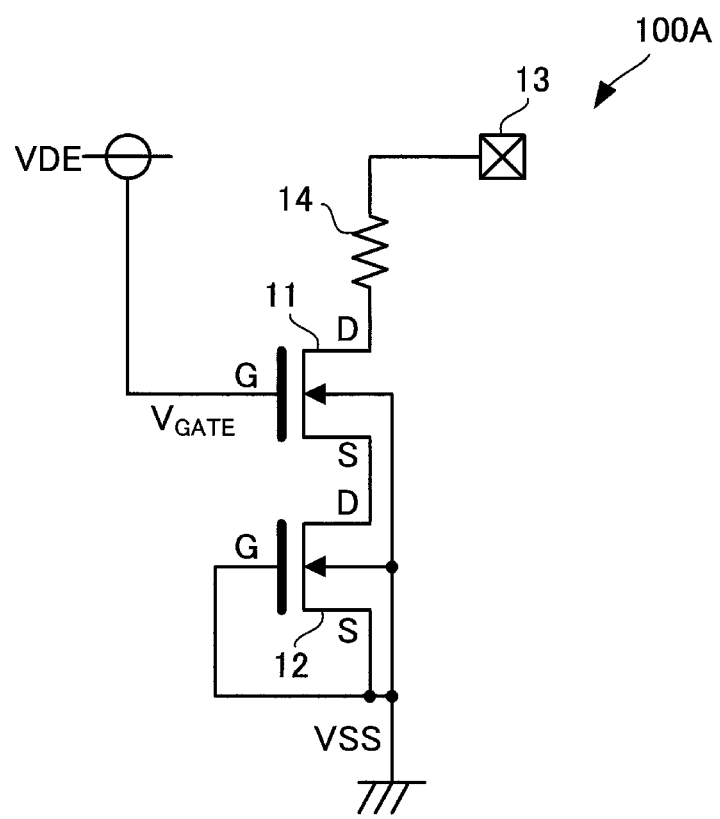
FIG. 4A is a diagram illustrating a configuration of an electrostatic protection circuit according to a first comparative example.
Figure 4B:
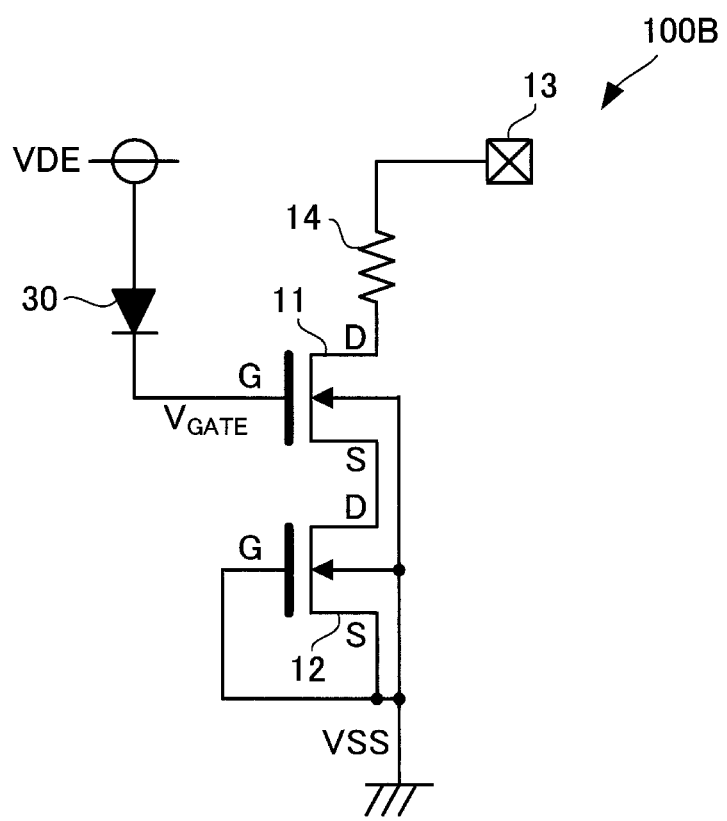
FIG. 4B is a diagram illustrating a configuration of an electrostatic protection circuit according to a second comparative example.

FIG. 4A is a diagram illustrating a configuration of an electrostatic protection circuit 100A according to a first comparative example, and FIG. 4B is a diagram illustrating a configuration of an electrostatic protection circuit 100B according to a second comparative example. In FIG. 4A and FIG. 4B, the same reference numerals are allocated to the same or corresponding configuration elements to the configuration elements of the electrostatic protection circuit 10 according to the first exemplary embodiment of technology disclosed herein (see FIG. 3), and duplicate explanation thereof will be omitted.

As illustrated in FIG. 4A, the electrostatic protection circuit 100A according to the first comparative example differs from the electrostatic protection circuit 10 according to the exemplary embodiment of the technology disclosed herein (see FIG. 3) in that the gate of the N-MOS transistor 11 is directly connected to the power source line VDE. A specific voltage (for example, 3.3V) is applied between the ground voltage line VSS and the power source line VDE in the electrostatic protection circuit 100A during normal operation. The N-MOS transistor 11 is thereby placed in an ON state, and the N-MOS transistor 12 is maintained in an OFF state, and so tolerant functionality is exhibited similarly to the electrostatic protection circuit 10 according to the exemplary embodiment of technology disclosed herein.

Similarly to the electrostatic protection circuit 10, in the electrostatic protection circuit 100A an ON state is adopted by a parasitic npn transistor of the N-MOS transistors 11 and 12 when an ESD surge is applied to the external input terminal 13, and the surge current flows in the N-MOS transistors 11 and 12 (snapback). By bringing the N-MOS transistor 11 close to the ON state by raising the gate voltage $V_{GATE}$ of the N-MOS transistor 11 when the ESD surge is applied, the discharge performance of the electrostatic protection circuit can be improved. However, when the ESD is being applied, a voltage is not supplied between the ground voltage line VSS and the power source line VDE, and due to the electrostatic protection circuit 100A, the gate voltage $V_{GATE}$ of the N-MOS transistor 11 during ESD surge application is substantially 0V. Namely, in the electrostatic protection circuit 100A according to the first comparative example, it is difficult to improve the discharge performance in response to an ESD surge by raising the gate voltage $V_{GATE}$ of the N-MOS transistor 11 during ESD surge application.

As a configuration to improve the discharge performance in response to ESD surge, a configuration of the electrostatic protection circuit 100B according to the second comparative example might be contemplated as illustrated in FIG. 4B. The electrostatic protection circuit 100B differs from the electrostatic protection circuit 100A according to the first comparative example in that a diode 30 is included between the gate of the N-MOS transistor 11 and the power source line VDE. The anode of the diode 30 is connected to the power source line VDE, and the cathode is connected to the gate of the N-MOS transistor 11. When an ESD surge is applied to the external input terminal 13 in the electrostatic protection circuit 100B, gate voltage $V_{GATE}$ rises to follow the rise in the drain voltage of the N-MOS transistor 11 due to AC coupling between the drain and the gate of the N-MOS transistor 11. Namely, when the ESD surge is applied to the external input terminal 13, the gate of the N-MOS transistor 11 is charged with a charge due to parasitic capacitance between the drain and the gate of the N-MOS transistor 11, raising the gate voltage $V_{GATE}$ of the N-MOS transistor 11. The charge charging the gate of the N-MOS transistor 11 is prevented from migrating to the power source line by the diode 30, and this charge remains in the gate of the N-MOS transistor 11. The voltage $V_{GATE}$ of the gate of the N-MOS transistor 11 that has been raised according to application of the ESD surge is thereby maintained as it is. Thus the gate voltage $V_{GATE}$ of the N-MOS transistor 11 that has been raised according to application of the ESD surge is maintained in the electrostatic protection circuit 100B, and so the discharge performance in response to ESD surge is higher than that of the electrostatic protection circuit 100A according to the first comparative example.

However, a new issue arises in the electrostatic protection circuit 100B according to the second comparative example when a successive pulse signal (AC signal) is input to the external input terminal 13 during normal operation. Namely, when a successive pulse signal (AC signal) is input to the external input terminal 13 during normal operation, similarly to during ESD surge application, the gate voltage $V_{GATE}$ of the N-MOS transistor 11 is raised by AC coupling between the drain and the gate. The raised gate voltage $V_{GATE}$ of the N-MOS transistor 11 is maintained as it is. Namely, in the electrostatic protection circuit 100B according to the second comparative example, when a successive pulse signal (AC signal) is input to the external input terminal 13 during normal operation, there is a concern that a state in which the gate voltage $V_{GATE}$ of the N-MOS transistor 11 exceeds the permissible voltage is maintained.

In the electrostatic protection circuit 100A according to the first comparative example, when a successive pulse signal (AC signal) is input to the external input terminal 13 during normal operation, the charge charging the gate of the N-MOS transistor 11 is discharged to the power source line VDE. The gate voltage $V_{GATE}$ of the N-MOS transistor 11 accordingly does not rise, and the issue described above with respect to the electrostatic protection circuit 100B according to the second comparative example does not arise. Thus, as described above, the electrostatic protection circuit 100A according to the first comparative example does not exhibit sufficient discharge performance in response to ESD surge.

Explanation follows regarding respective operations when ESD surge is applied to, and when a successive pulse signal (AC signal) is input to, the external input terminal 13 in the electrostatic protection circuit 10 according to the first exemplary embodiment of technology disclosed herein, with reference to FIG. 3. It is assumed that during ESD surge application to the external input terminal 13 a voltage is not being applied between the ground voltage line VSS and the power source line VDE.

In the electrostatic protection circuit 10, the parasitic npn transistor of the N-MOS transistors 11 and 12 adopts an ON state when an ESD surge is applied to the external input terminal 13, and the surge current flows in the N-MOS transistors 11 and 12 (snapback). Charge charges the gate of the N-MOS transistor 11 due to the parasitic capacitance between the drain and the gate of the N-MOS transistor 11 caused by application of the ESD surge to the external input terminal 13, and the gate voltage $V_{GATE}$ of the N-MOS transistor 11 rises. When the gate voltage $V_{GATE}$ of the N-MOS transistor 11 becomes greater than the voltage of the power source line VDE, the N-MOS transistor 22 adopts an ON state, and the charge charging the gate of the N-MOS transistor 11 is drawn to the power source line VDE. The gate voltage $V_{GATE}$ of the N-MOS transistor 11 that has risen according to the ESD surge application therefore starts falling, but falling of the gate voltage $V_{GATE}$ is suppressed by the ON resistance of the N-MOS transistor 22, and the gate voltage $V_{GATE}$ of a certain level is secured. Thus during ESD surge application in the electrostatic protection circuit 10, the gate voltage $V_{GATE}$ is secured at a certain level, and so it is possible to raise the discharge performance in response to ESD surge to higher than in the electrostatic protection circuit 100A according to the first comparative example.

When a successive pulse signal (AC signal) is input to the external input terminal 13 of the electrostatic protection circuit 10 during normal operation, similarly to during ESD surge application, the gate voltage $V_{GATE}$ of the N-MOS transistor 11 rises due to AC coupling between the drain and the gate. When the gate voltage $V_{GATE}$ of the N-MOS transistor 11 becomes greater than the voltage of the power source line VDE, the N-MOS transistor 22 adopts an ON state, and the charge charging the gate of the N-MOS transistor 11 is drawn to the power source line VDE. Namely, a discharge circuit is formed between the gate of the N-MOS transistor 11 and the power source line VDE for charge that is charging the gate of the N-MOS transistor 11. This thereby enables the gate voltage $V_{GATE}$ of the N-MOS transistor 11 that has risen according to the input of the successive pulse signal (AC signal) to the external input terminal 13 to fall. Thus when a successive pulse signal (AC signal) is input to the external input terminal 13, a state in which the gate voltage $V_{GATE}$ of the N-MOS transistor 11 exceeds the permissible voltage, such as in the electrostatic protection circuit 100B of the second comparative example, can be prevented from being maintained.

Thus as described above, the electrostatic protection circuit 10 according to the exemplary embodiment of the technology disclosed herein is able to suppress a rise in the gate voltage $V_{GATE}$ according to input of a successive pulse signal to the external input terminal 13, while achieving higher discharge performance in response to ESD surge applied to the external input terminal 13.

Second Exemplary Embodiment

Figure 5:
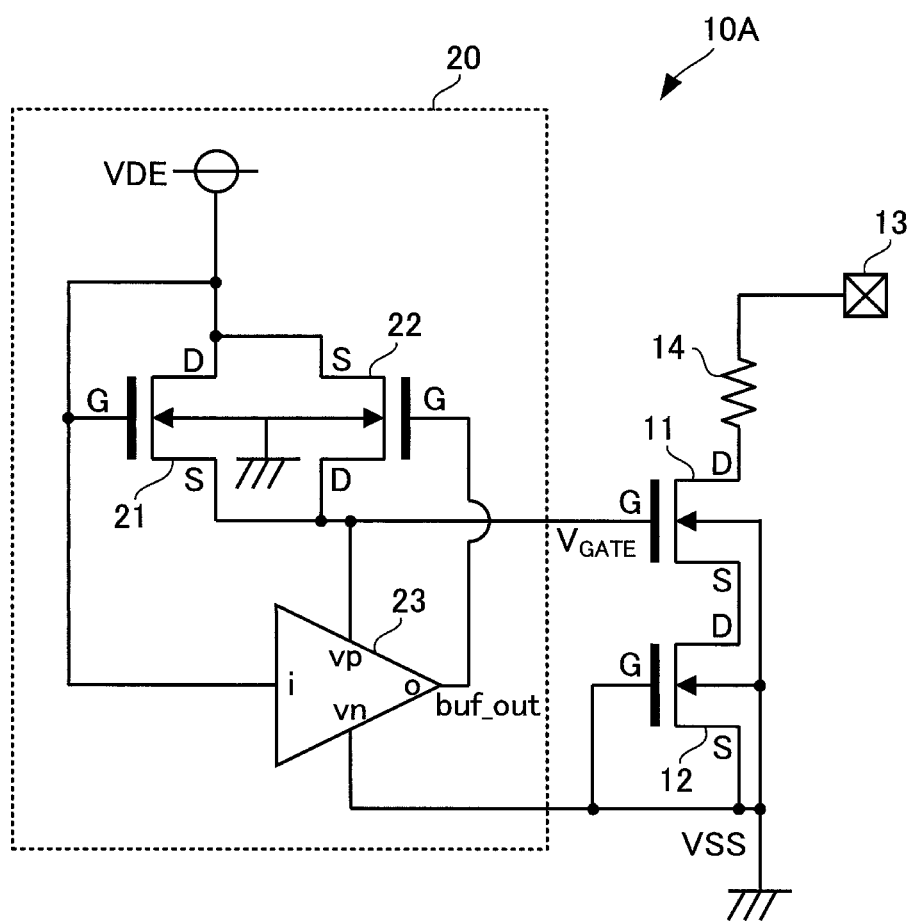
FIG. 5 is a diagram illustrating a configuration of an electrostatic protection circuit according to a second exemplary embodiment of technology disclosed herein.

FIG. 5 is a diagram illustrating a configuration of an electrostatic protection circuit 10A according to a second exemplary embodiment of technology disclosed herein. In FIG. 5, the same reference numerals are allocated to the same or corresponding configuration elements to the configuration elements of the electrostatic protection circuit 10 according to the first exemplary embodiment of technology disclosed herein (see FIG. 3), and duplicate explanation thereof will be omitted. The protected circuit 50 (see FIG. 1) is omitted from illustration in FIG. 5.

The electrostatic protection circuit 10A differs from the electrostatic protection circuit 10 according to the first exemplary embodiment in further including a buffer circuit 23 in the gate control section 20. The buffer circuit 23 includes an input terminal i that is connected to the power source line VDE, and an output terminal o that is connected to the gate of the N-MOS transistor 22. The buffer circuit 23 also includes a positive side power source terminal vp that is connected to the gate of the N-MOS transistor 11, and a negative side power source terminal vn that is connected to the ground voltage line VSS.

The buffer circuit 23 operates with a voltage supplied between the positive side power source terminal vp and the negative side power source terminal vn as the power source voltage. When a specific voltage (for example, 3.3V) is supplied between the power source line VDE and the ground voltage line VSS (namely when a specific voltage is input to the input terminal i), the buffer circuit 23 outputs an output voltage buf_out from the output terminal o equivalent to the power supply voltage supplied between the positive side power source terminal vp and the negative side power source terminal vn (namely, the gate voltage $V_{GATE}$). When a voltage is not supplied between the power source line VDE and the ground voltage line VSS (namely, when the input voltage to the buffer circuit 23 is 0V), the output voltage buf_out of the buffer circuit 23 becomes 0V.

Figure 6:
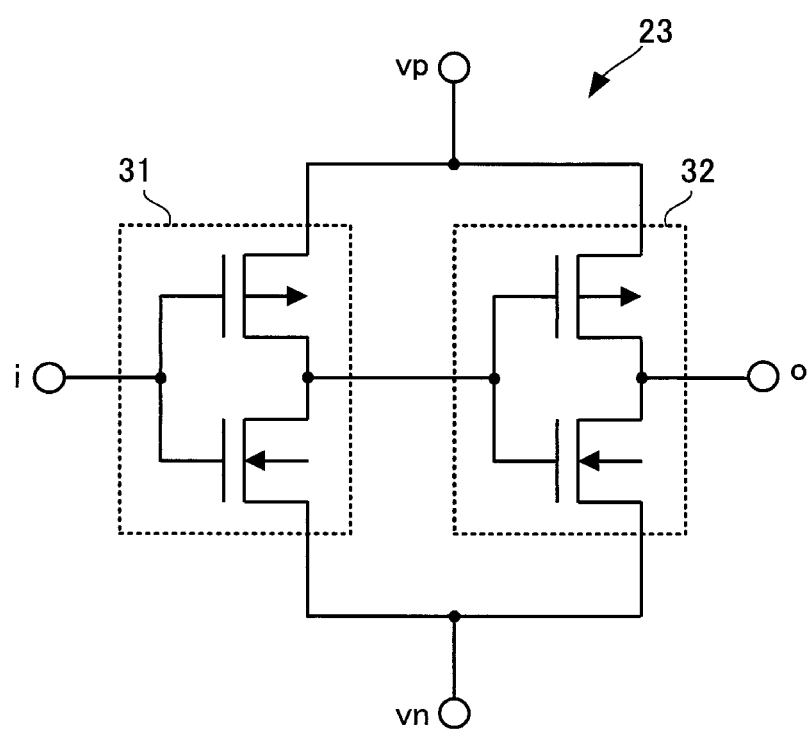
FIG. 6 is a diagram illustrating an example of a configuration of a buffer circuit according to an exemplary embodiment of technology disclosed herein.

FIG. 6 is a diagram illustrating an example of a configuration of the buffer circuit 23. As illustrated in FIG. 6, the buffer circuit 23 is configured including two complementary MOS (CMOS) inverters 31 and 32 connected together in series.

Explanation follows regarding operation of the electrostatic protection circuit 10A according to the second exemplary embodiment. During normal operation of the electrostatic protection circuit 10A, a specific voltage (for example, 3.3V) is, for example, applied between the ground voltage line VSS and the power source line VDE. The N-MOS transistor 11 accordingly adopts an ON state, and the N-MOS transistor 12 is maintained in an OFF state. Thereby, similarly to in the electrostatic protection circuit 10 according to the first exemplary embodiment, tolerant functionality is exhibited that permits a voltage of magnitude exceeding the permissible voltage of the N-MOS transistors 11 and 12 to be input to the external input terminal 13.

During normal operation, the buffer circuit 23 outputs from the output terminal o the output voltage buf_out equivalent to the gate voltage $V_{GATE}$ of the N-MOS transistor 11, and supplies the output voltage buf_out to the N-MOS transistor 22. Thus operation of the N-MOS transistor 22 when a successive pulse signal (AC signal) is input to the external input terminal 13 is similar to operation of the N-MOS transistor 22 in the electrostatic protection circuit 10 according to the first exemplary embodiment. Namely, the N-MOS transistor 22 adopts an ON state when the successive pulse signal (AC signal) is input to the external input terminal 13 and the gate voltage $V_{GATE}$ of the N-MOS transistor 11 increases to become greater than the voltage of the power source line VDE. This thereby draws the charge charging the gate of the N-MOS transistor 11 to the power source line VDE, enabling the gate voltage $V_{GATE}$ of the N-MOS transistor 11 to fall. It is accordingly possible to prevent the gate voltage $V_{GATE}$ of the N-MOS transistor 11 being maintained in a state exceeding the permissible voltage as in the electrostatic protection circuit 100B according to the second comparative example.

In the electrostatic protection circuit 10A, the parasitic npn transistor of the N-MOS transistors 11 and 12 adopts an ON state when the ESD surge is applied to the external input terminal 13, and surge current flows in the N-MOS transistors 11 and 12 (snapback). Charge charges the gate of the N-MOS transistor 11 due to the parasitic capacitance between the drain and the gate of the N-MOS transistor 11 arising from application of the ESD surge to the external input terminal 13, and the gate voltage $V_{GATE}$ of the N-MOS transistor 11 rises.

During ESD surge application, a voltage is not applied between the ground voltage line VSS and the power source line VDE, and so the output voltage buf_out of the buffer circuit 23 is maintained at 0V, and the N-MOS transistor 22 is maintained in an OFF state. As a result, the gate voltage $V_{GATE}$ of the N-MOS transistor 11 that has risen according to application of the ESD surge to the external input terminal 13 is maintained and does not fall. The electrostatic protection circuit 10A according to the second exemplary embodiment thereby enables the level of the gate voltage $V_{GATE}$ of the N-MOS transistor 11 during ESD surge application to be higher than in the electrostatic protection circuit 10 according to the first exemplary embodiment. Namely, the electrostatic protection circuit 10A according to the second exemplary embodiment enables the discharge performance in response to ESD surge to be improved compared to that of the electrostatic protection circuit 10 according to the first exemplary embodiment.

The electrostatic protection circuit 10A according to the second exemplary embodiment thereby enables a rise in the gate voltage $V_{GATE}$ according to input of a successive pulse signal to the external input terminal 13 to be suppressed, while achieving higher discharge performance in response to ESD surge applied to the external input terminal 13.

Figure 7:
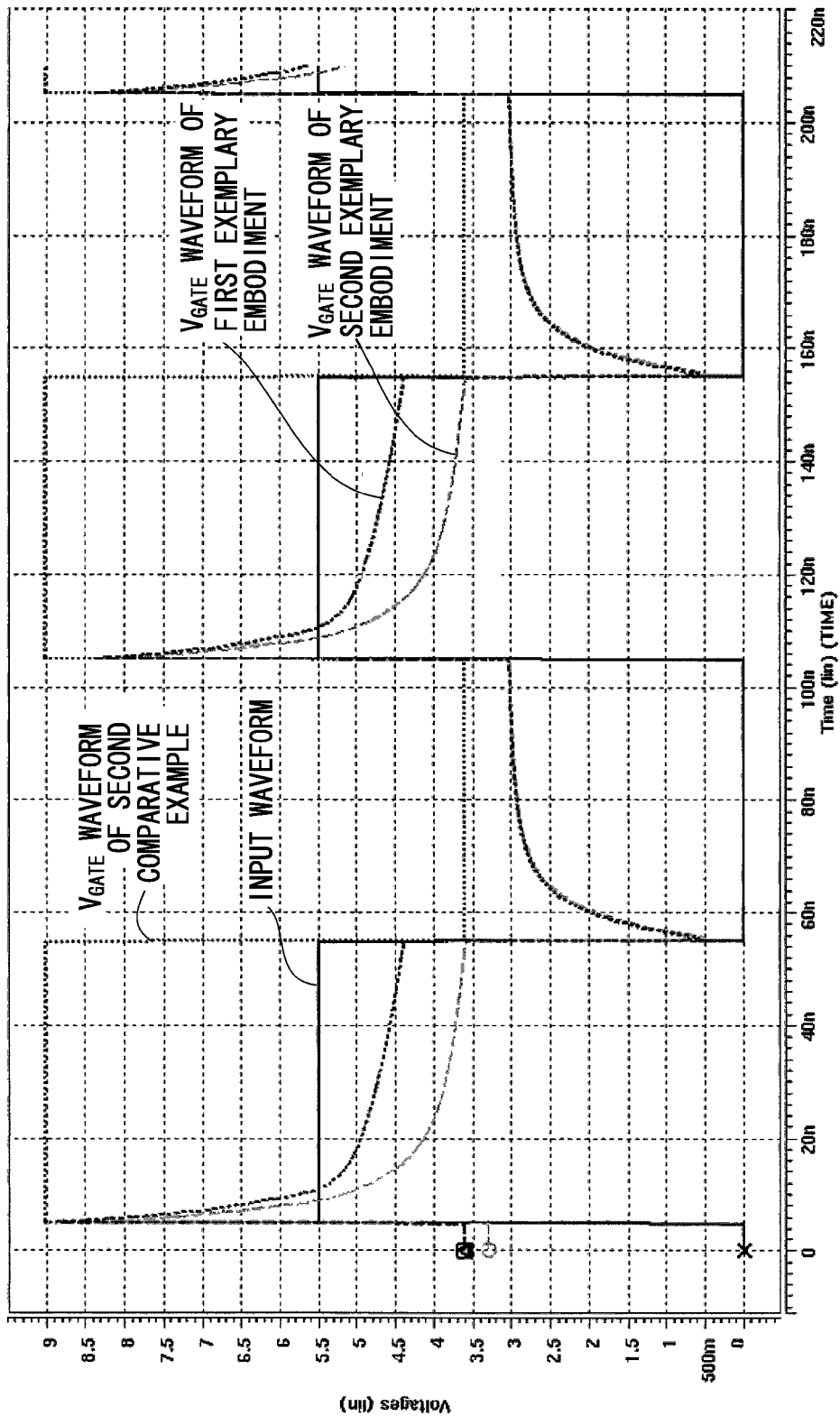
FIG. 7 is a graph illustrating $V_{GATE}$ waveforms during successive pulse signal input acquired by simulation.

FIG. 7 is a graph illustrating $V_{GATE}$ waveforms (gate voltage waveform of the N-MOS transistor 11) during input of a successive pulse signals (an AC signal) acquired by simulating the electrostatic protection circuits 10 and 10A according to the first and second exemplary embodiments of technology disclosed herein, and the electrostatic protection circuit 100B according to the second comparative example. In this simulation, 3.6V is applied between the ground voltage line VSS and the power source line VDE, and a successive pulse signal (AC signal) of 5.5V is input to the external input terminal 13.

As illustrated in FIG. 7, in the electrostatic protection circuit 100B according to the second comparative example, the gate voltage $V_{GATE}$ of the N-MOS transistor 11 rises to follow input of the successive pulse signal (AC signal) to the external input terminal 13. In the electrostatic protection circuit 100B, the raised gate voltage $V_{GATE}$ of the N-MOS transistor 11 is maintained without falling as long as the input signal does not fall. This is because migration of charge charging the gate of the N-MOS transistor 11 is prevented by the diode 30 (see FIG. 4B).

In the electrostatic protection circuits 10 and 10A according to the first and second exemplary embodiments of the technology disclosed herein, the gate voltage $V_{GATE}$ of the N-MOS transistor 11 that has risen according to input of the successive pulse signal (AC signal) to the external input terminal 13 immediately starts to fall. This is because the N-MOS transistor 22 adopts an ON state when the gate voltage $V_{GATE}$ of the N-MOS transistor 11 becomes larger than the voltage of the power source line VDE, and draws charge charging the gate of the N-MOS transistor 11 to the power source line VDE. Thus the electrostatic protection circuits 10 and 10A according to the first and second exemplary embodiments of technology disclosed herein enable the gate voltage $V_{GATE}$ of the N-MOS transistor 11 to be suppressed from rising according to input of the successive pulse signal (AC signal) to the external input terminal 13. Thus application to the N-MOS transistor 11 of voltage exceeding the permissible voltage can be prevented.

Figure 8:
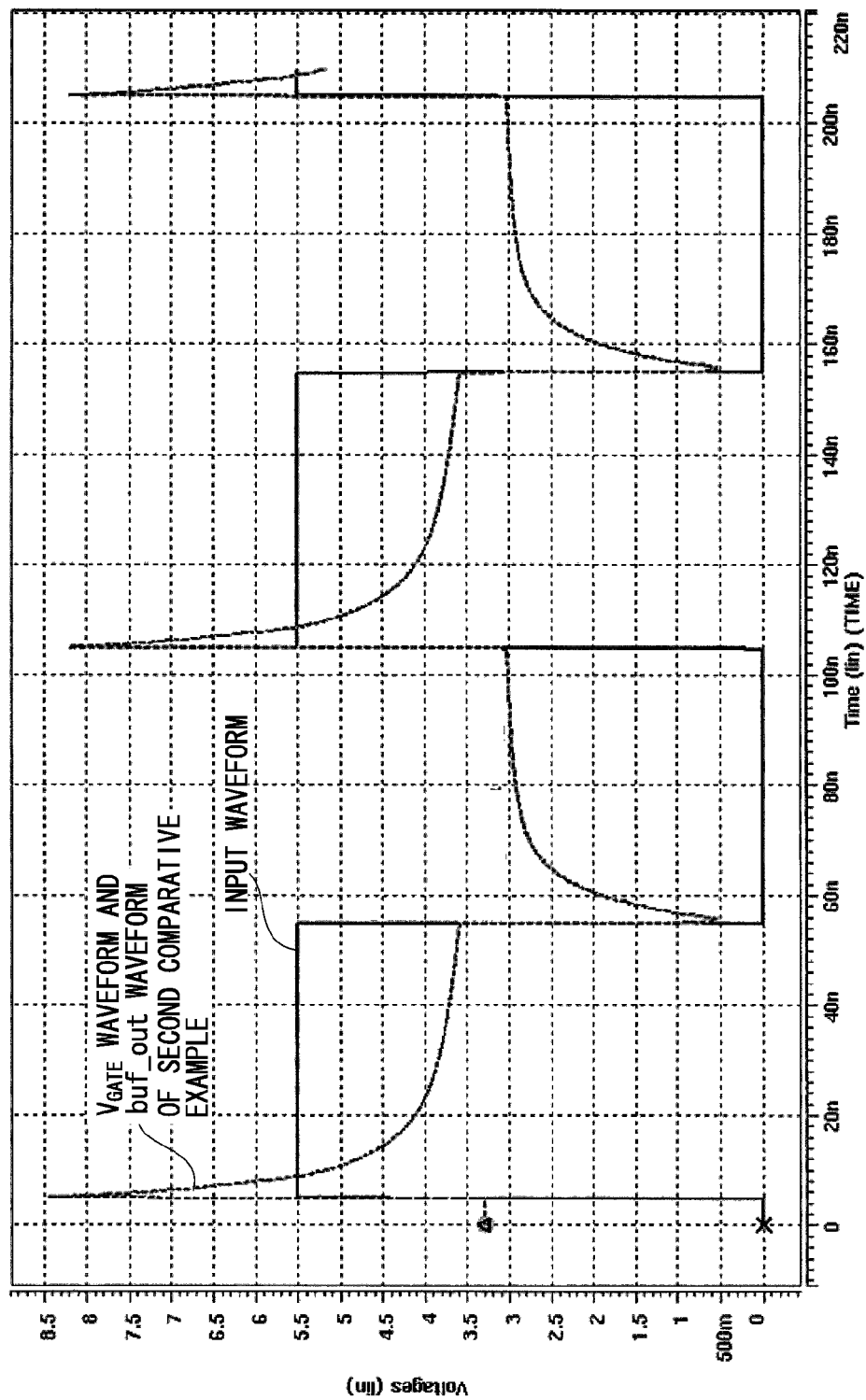
FIG. 8 is a graph illustrating a $V_{GATE}$ waveform and a buf_out waveform during successive pulse signal input acquired by simulation.

FIG. 8 is a graph illustrating a $V_{GATE}$ waveform and a buf_out waveform (output voltage waveform of the buffer circuit 23) during input of a successive pulse signal (AC signal) acquired by simulating the electrostatic protection circuit 10A according to the second exemplary embodiment of the technology disclosed herein. The $V_{GATE}$ waveform and the input waveform (the successive pulse signal (AC signal) waveform) input to the external input terminal 13) is the same as illustrated in FIG. 7. As illustrated in FIG. 8, the buf_out waveform substantially matches the $V_{GATE}$ waveform, and operation of the buffer circuit 23 is as expected.

Figure 9:
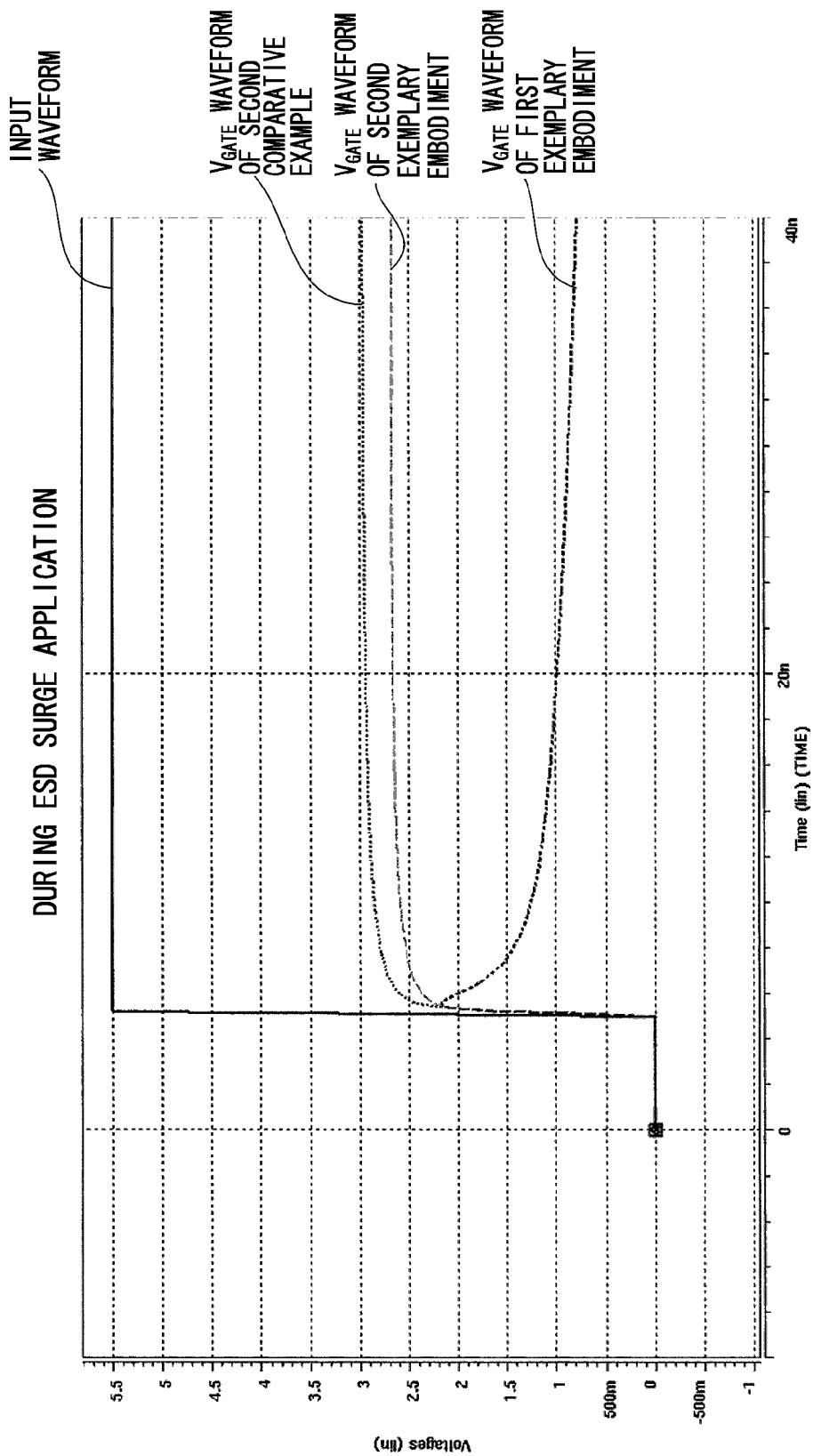
FIG. 9 is a graph illustrating $V_{GATE}$ waveforms during application of an ESD surge acquired by simulation.

FIG. 9 is a graph illustrating a $V_{GATE}$ waveform during ESD surge application acquired by simulating the electrostatic protection circuits 10 and 10A according to the first and second exemplary embodiments of technology disclosed herein and the electrostatic protection circuit 100B according to the second comparative example. In the simulation, the voltages of the ground voltage line VSS and the power source line VDE are 0V, and a pulse voltage of 5.5V is input to the external input terminal 13 to simulate an ESD surge.

As illustrated in FIG. 9, in the electrostatic protection circuit 10 according to the first exemplary embodiment of technology disclosed herein, the gate voltage $V_{GATE}$ of the N-MOS transistor 11 that has risen according to application of the ESD surge gradually reduces, but a certain level of voltage is secured. This is due to the ON resistance of the N-MOS transistor 22 that has adopted an ON state due to the gate voltage $V_{GATE}$ of the N-MOS transistor 11 becoming higher than the voltage of the power source line VDE. Thus due to securing a certain level of gate voltage $V_{GATE}$ during ESD surge application in this manner, the discharge performance in response to ESD surge is improved.

In the electrostatic protection circuit 10A according to the second exemplary embodiment of technology disclosed herein, the gate voltage $V_{GATE}$ of the N-MOS transistor 11 that has risen according to application of the ESD surge is maintained without falling, similarly to in the electrostatic protection circuit 100B according to the second comparative example. This is due to the output voltage buf_out of the buffer circuit 23 being 0V during ESD surge application, and the OFF state of the N-MOS transistor 22 being maintained, preventing migration of charge that has charged the gate of the N-MOS transistor 11. Thus due to the gate voltage $V_{GATE}$ of the N-MOS transistor 11 that has risen according to application of the ESD surge being maintained without falling, the discharge performance in response to ESD surge is higher than in the electrostatic protection circuit 10 according to the first exemplary embodiment.

Figure 10:
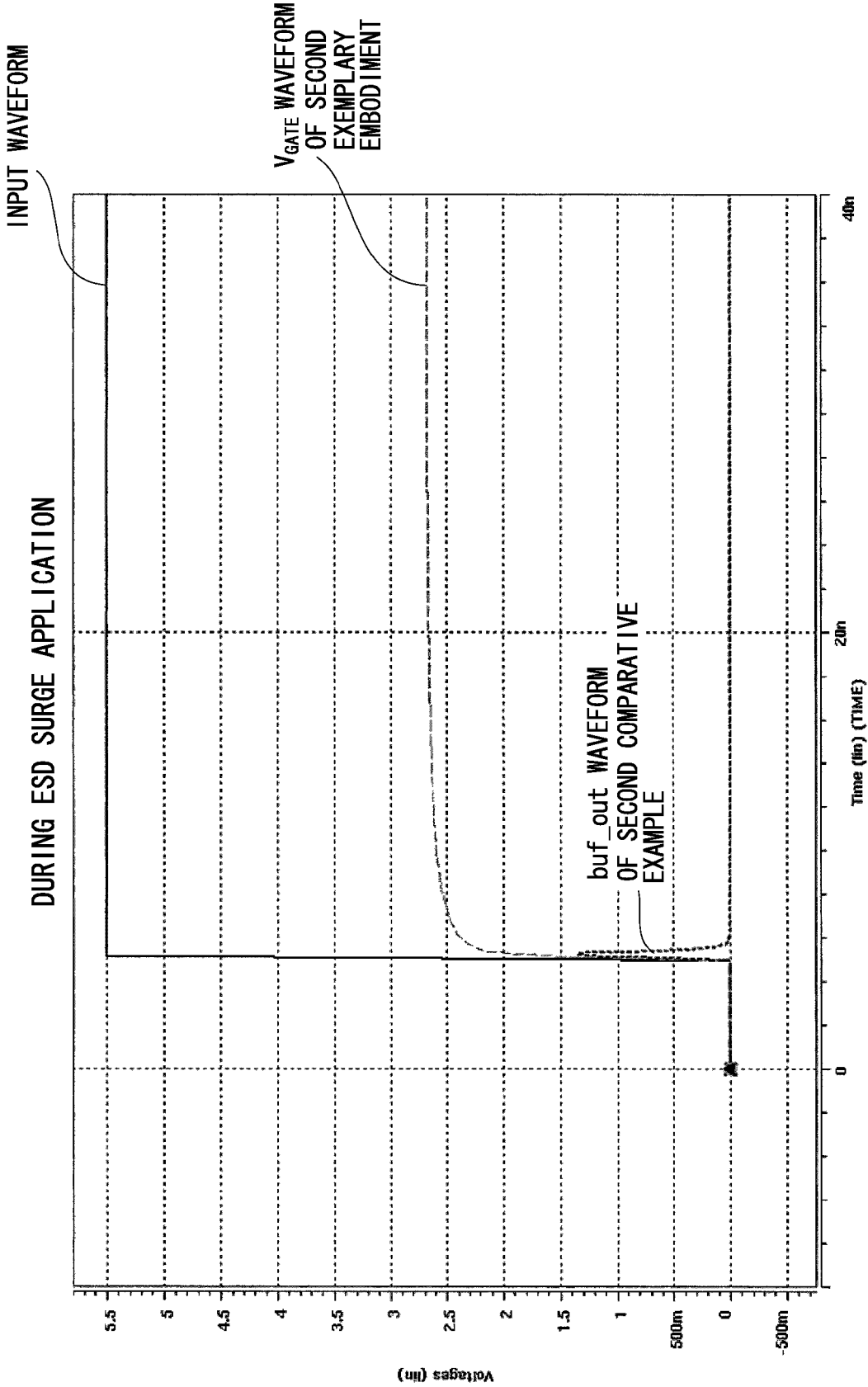
FIG. 10 is graph illustrating a $V_{GATE}$ waveform and a buf_out waveform during application of an ESD surge acquired by simulation.

FIG. 10 is a graph illustrating a $V_{GATE}$ waveform and a buf_out waveform during ESD surge application acquired by simulating the electrostatic protection circuit 10A according to the second exemplary embodiment of technology disclosed herein. The gate waveform $V_{GATE}$ and the input waveform (the voltage waveform assuming that an ESD surge has been input to the external input terminal 13) is similar to that illustrated in FIG. 9. As illustrated in FIG. 10, the buf_out waveform momentarily rises on ESD surge application and then swiftly converges on 0V. The OFF state of the N-MOS transistor 22 that takes the output voltage buf_out of the buffer circuit 23 as input is thereby maintained during ESD surge application.

Third Exemplary Embodiment

Figure 11:
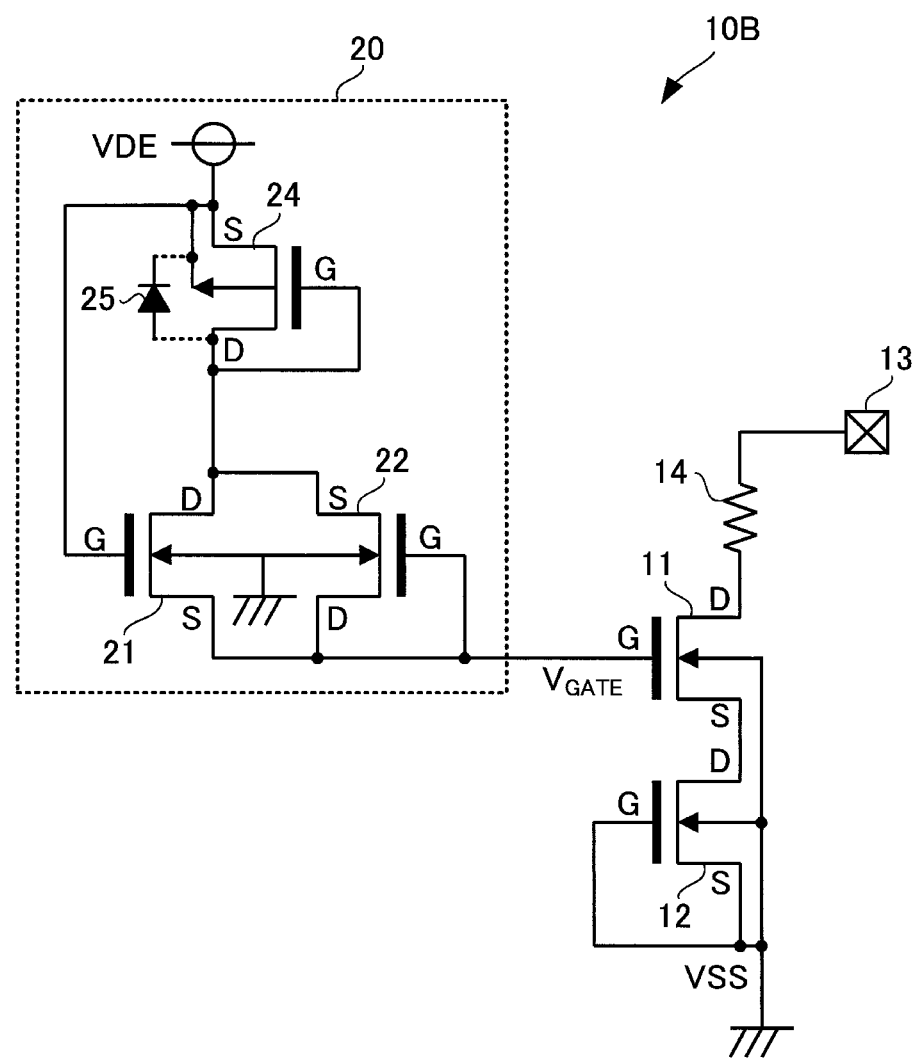
FIG. 11 is a diagram illustrating a configuration of an electrostatic protection circuit according to a third exemplary embodiment of technology disclosed herein.

FIG. 11 is a diagram illustrating a configuration of an electrostatic protection circuit 10B according to a third exemplary embodiment of technology disclosed herein. In FIG. 11 the same reference numerals are allocated to the same or corresponding configuration elements to the configuration elements of the electrostatic protection circuit 10 according to the first exemplary embodiment (see FIG. 3), and duplicate explanation thereof will be omitted. In FIG. 11, the protected circuit 50 (see FIG. 1) is omitted from illustration. The electrostatic protection circuit 10B according to the third exemplary embodiment differs from the electrostatic protection circuit 10 according to the first exemplary embodiment in further including a P-MOS transistor 24 between the power source line VDE and N-MOS transistors 21, 22. The source of the P-MOS transistor 24 is connected to the power source line VDE, and the drain and the gate of the P-MOS transistor 24 are connected to the drain of the N-MOS transistor 21 and the source of the N-MOS transistor 22.

In the electrostatic protection circuit 10B, during normal operation a specific voltage (for example, 3.3V) is applied between the ground voltage line VSS and the power source line VDE. The P-MOS transistor 24 and the N-MOS transistor 21 accordingly adopt an ON state, and the voltage of the power source line VDE (3.3V) is applied to the gate of the N-MOS transistor 11 through the P-MOS transistor 24 and the N-MOS transistor 21. More precisely, the gate voltage $V_{GATE}$ of the N-MOS transistor 11 has a magnitude of the result of a threshold value voltage Vth of the N-MOS transistor 21 being subtracted from the voltage of the power source line VDE (3.3V). The N-MOS transistor 11 accordingly adopts an ON state. The N-MOS transistor 12, however, is maintained in the OFF state. Thereby, similarly to in the electrostatic protection circuit 10 according to the first exemplary embodiment, tolerant functionality is exhibited that permits a voltage of magnitude exceeding the permissible voltage of the N-MOS transistors 11 and 12 to be input to the external input terminal 13.

In the electrostatic protection circuit 10B, when a successive pulse signal (AC signal) is input to the external input terminal 13 during normal operation, charge is charged to the gate of the N-MOS transistor 11, and the gate voltage $V_{GATE}$ of the N-MOS transistor 11 rises. The N-MOS transistor 22 and a parasitic diode 25 of the P-MOS transistor 24 adopt an ON state when the gate voltage $V_{GATE}$ of the N-MOS transistor 11 becomes larger than the voltage of the power source line VDE. A discharge path is thereby formed between the gate of the N-MOS transistor 11 and the power source line VDE for the charge charging the gate of the N-MOS transistor 11.

Figure 12:
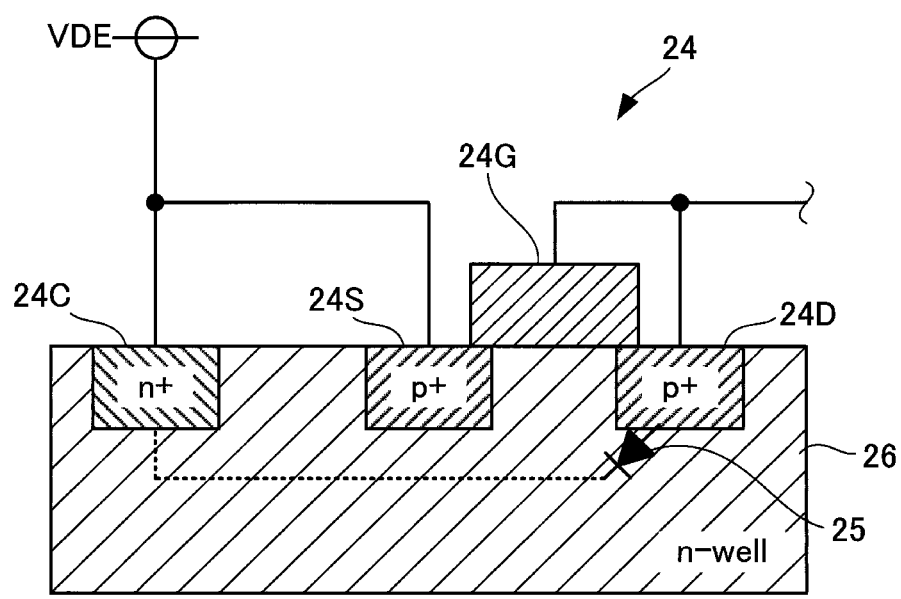
FIG. 12 is a cross-section of a P-MOS transistor according to an exemplary embodiment of technology disclosed herein.

FIG. 12 is a cross-section of the P-MOS transistor 24. The P-MOS transistor 24 includes a p-type drain region 24D and a p-type source region 24S formed in the surface area of an n-well region 26, and a gate electrode 24G formed between the drain region 24D and the source region 24S. The P-MOS transistor 24 includes an n-type contact 24C that is formed in the surface area of the n-well region 26 and is connected to the power line VDE together with the source region 24S. The P-MOS transistor 24 includes a parasitic diode 25 including the drain region 24D as the anode, and the n-well region 26 as the cathode.

When the gate voltage $V_{GATE}$ of the N-MOS transistor 11 becomes larger than the voltage of the power source line VDE, the parasitic diode 25 adopts an ON state together with the N-MOS transistor 22. Charge charged in the gate of the N-MOS transistor 11 is thereby drawn to the power source line VDE, enabling the gate voltage $V_{GATE}$ of the N-MOS transistor 11 that has risen according to input of a successive pulse signal (AC signal) to the external input terminal 13 to fall. Thus when the successive pulse signal (AC signal) has been input to the external input terminal 13, the gate voltage $V_{GATE}$ of the N-MOS transistor 11 can be prevented from being maintained in a state exceeding the permissible voltage, as in the electrostatic protection circuit 100B according to the second comparative example.

In the electrostatic protection circuit 10B, when a ESD surge is applied to the external input terminal 13, the parasitic npn transistor of the N-MOS transistors 11 and 12 adopts an ON state, and surge current flows in the N-MOS transistors 11 and 12 (snapback). Charge is charged to the gate of the N-MOS transistor 11 due to parasitic capacitance between the drain and the gate of the N-MOS transistor 11 arising from application of the ESD surge to the external input terminal 13, raising the gate voltage $V_{GATE}$ of the N-MOS transistor 11. When the gate voltage $V_{GATE}$ of the N-MOS transistor 11 becomes greater than the voltage of the power source line VDE, the N-MOS transistor 22 and the parasitic diode 25 of the P-MOS transistor 24 adopt an ON state. The gate voltage $V_{GATE}$ of the N-MOS transistor 11 that has risen according to application of the ESD surge then starts to fall, but the gate voltage $V_{GATE}$ is suppressed from falling by the ON resistance of the N-MOS transistor 22 and the parasitic diode 25. Thus a certain level of gate voltage $V_{GATE}$ can be secured during ESD surge application, enabling the discharge performance in response to ESD surge to be improved.

In the electrostatic protection circuit 10B according to the third exemplary embodiment, the charge charged to the gate of the N-MOS transistor 11 according to ESD surge application is discharged to the power source line VDE through the two elements of the N-MOS transistor 22 and the parasitic diode 25. This thereby enables a higher effect of suppressing the gate voltage $V_{GATE}$ of the N-MOS transistor 11 from falling during ESD surge application than that of the electrostatic protection circuit 10 according to the first exemplary embodiment. Namely, electrostatic protection circuit 10B according to the third exemplary embodiment enables a higher discharge performance in response to ESD surge to be achieved than that of the electrostatic protection circuit 10 according to the first exemplary embodiment.

Due to the addition of the P-MOS transistor 24, the electrostatic protection circuit 10B also enables a higher ability to withstand ESD surge applied between the ground voltage line VSS and the power source line VDE to be achieved than that of the electrostatic protection circuit 10 according to the first exemplary embodiment. Explanation follows regarding the reason therefor.

Figure 13:
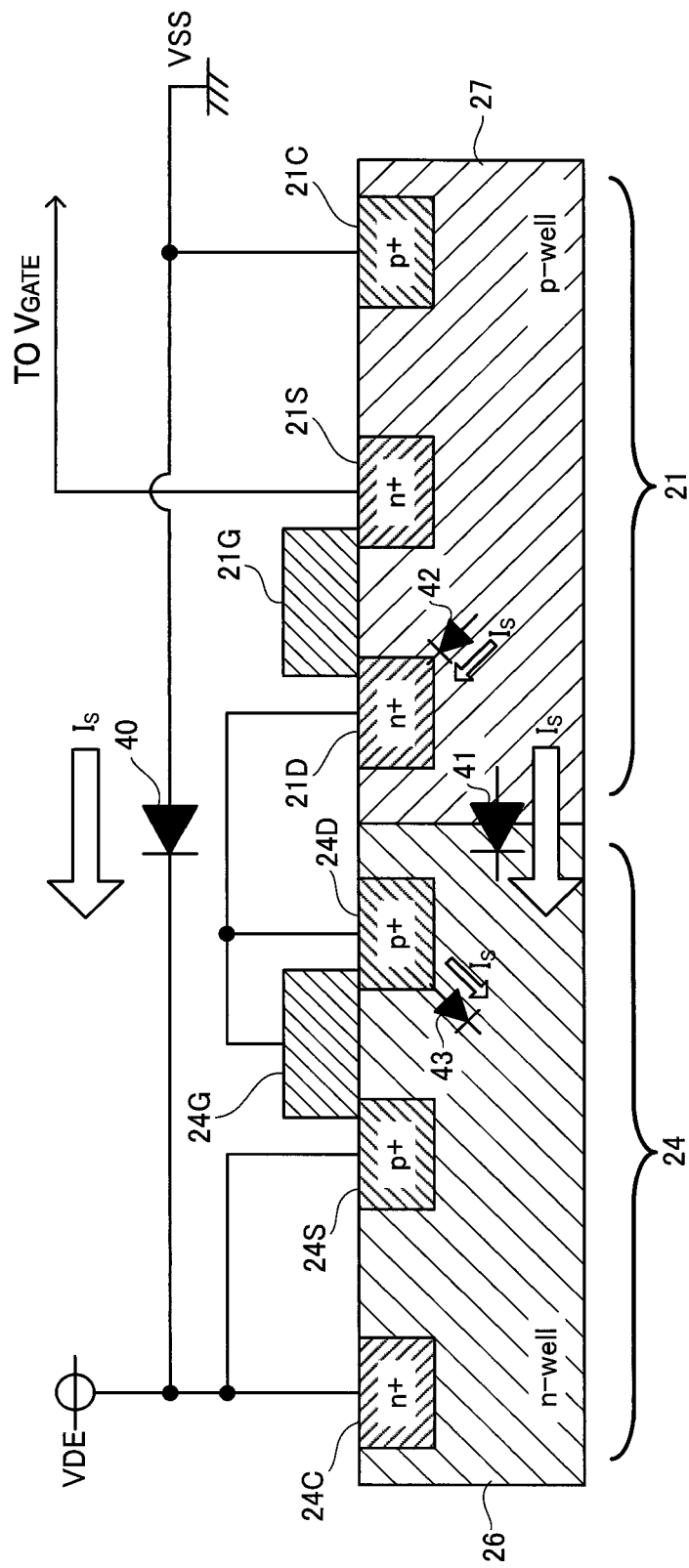
FIG. 13 is a cross-section of a P-MOS transistor and an N-MOS transistor according to the third exemplary embodiment of technology disclosed herein.

FIG. 13 is a cross-section of the P-MOS transistor 24 and the N-MOS transistor 21. The cross-sectional structure of the P-MOS transistor 24 is as explained above. The N-MOS transistor 21 includes an n-type drain region 21D and an n-type source region 21S formed in the surface area of a p-well region 27, with a gate electrode 21G formed between the drain region 21D and the source region 21S. A p-type contact region 22C connected to the ground voltage line VSS is formed in the surface area of the p-well region 27. The p-well region 27 is in contact with the n-well region 26. An electrostatic protection diode 40 is connected between the power source line VDE and the ground voltage line VSS.

In the electrostatic protection circuit 10B according to the third exemplary embodiment, a case is envisaged in which an ESD surge, with direction of surge current $I_s$ in the direction from the ground voltage line VSS toward the power source line VDE, is applied between the ground voltage line VSS and the power source line VDE. In such cases a main discharge path is formed for the ESD surge by the large size (i.e. low resistance) electrostatic protection diode 40 and a parasitic diode 41 formed by the p-well region 27 and the n-well region 26 (illustrated by the wide arrow in FIG. 13). Discharge paths are also formed by a parasitic diode 42 formed by the p-well region 27 and the drain region 21D, and by a parasitic diode 43 formed by the drain region 24D and the n-well region 26 (illustrated by the thin arrows in FIG. 13). However, due to the parasitic diodes 42 and 43 being connected together in series and having a larger resistance than the main discharge path, the surge current $I_s$ is suppressed from flowing in the parasitic diodes 42 and 43.

In FIG. 13, the N-MOS transistor 21 is interchangeable with the N-MOS transistor 22. Namely, the N-MOS transistor 22 includes a parasitic diode connected in series to the parasitic diode 43. A discharge path is formed for the ESD surge by the serially connected parasitic diode of the N-MOS transistor 22, and the parasitic diode 43 of the P-MOS transistor 24. This discharge path has a higher resistance than the main discharge path, and so surge current is suppressed from flowing in the parasitic diode of the N-MOS transistor 22 and the parasitic diode 43 of the P-MOS transistor 24.

Figure 14:
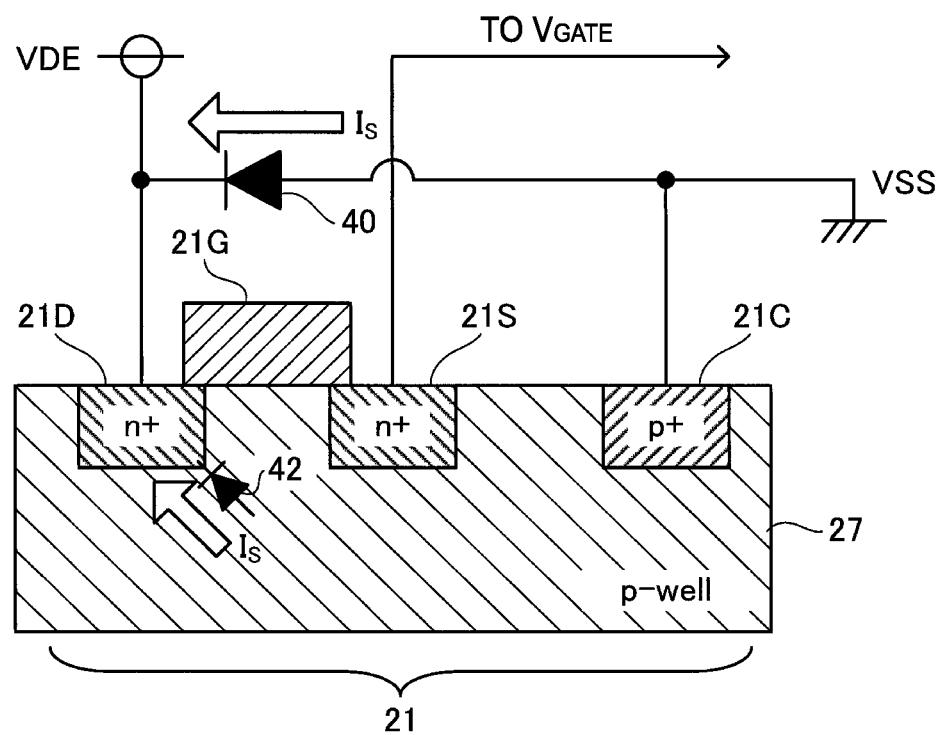
FIG. 14 is a cross-section of an N-MOS transistor in an electrostatic protection circuit according to the first exemplary embodiment of technology disclosed herein.

FIG. 14 is a cross-section of the N-MOS transistor 21 in the electrostatic protection circuit 10 according to the first exemplary embodiment. In the electrostatic protection circuit 10 according to the first exemplary embodiment, the drain region 21D of the N-MOS transistor 21 is directly connected to the power source line VDE. The electrostatic protection diode 40 is also connected between the power source line VDE and the ground voltage line VSS.

In the electrostatic protection circuit 10 according to the first exemplary embodiment, a case is envisaged in which an ESD surge, with direction of surge current $I_s$ in the direction from the ground voltage line VSS toward the power source line VDE, is applied between the ground voltage line VSS and the power source line VDE. In the electrostatic protection circuit 10 according to the first exemplary embodiment, the parasitic diode 42 formed by the p-well region 27 and the drain region 21D of the N-MOS transistor 21 is connected in parallel to the electrostatic protection diode 40. Thus the surge current $I_s$ flows not only in the electrostatic protection diode 40, but also in the parasitic diode 42. The electrostatic protection circuit 10 according to the first exemplary embodiment is not configured to obtain a suppression effect on the surge current $I_s$ flowing in the parasitic diode 42, and so there is a risk of damage to the N-MOS transistor 21 by excessive surge current $I_s$.

In FIG. 14, the N-MOS transistor 21 is interchangeable with the N-MOS transistor 22. Namely, there is also a risk of the N-MOS transistor 22 being damaged by ESD surge applied between the ground voltage line VSS and the power source line VDE.

However, in the electrostatic protection circuit 10B according to the third exemplary embodiment, due to insertion of the P-MOS transistor 24 between the power source line VDE and the N-MOS transistors 21, 22, the surge current $I_s$ flowing in the parasitic diode of the N-MOS transistors 21, 22 is suppressed. The risk of the N-MOS transistors 21 and 22 being damaged by ESD surge applied between the ground voltage line VSS and the power source line VDE is accordingly smaller than that in the electrostatic protection circuit 10 according to the first exemplary embodiment. Namely, the electrostatic protection circuit 10B according to the third exemplary embodiment can achieve a higher ability to withstand ESD surge applied between the ground voltage line VSS and the power source line VDE than that of the electrostatic protection circuit 10 according to the first exemplary embodiment.

Fourth Exemplary Embodiment

Figure 15:
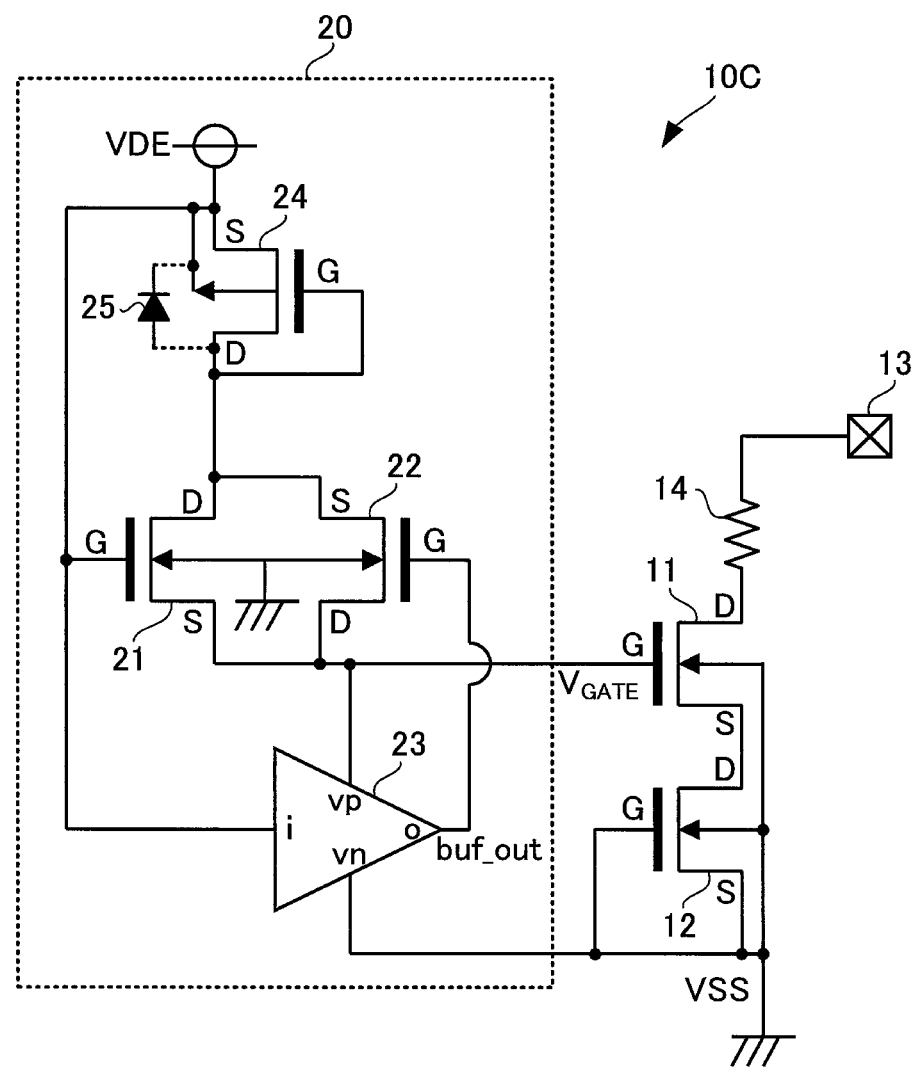
FIG. 15 is a diagram illustrating a configuration of an electrostatic protection circuit according to a fourth exemplary embodiment of technology disclosed herein.

FIG. 15 is a diagram illustrating a configuration of an electrostatic protection circuit 10C according to a fourth exemplary embodiment of technology disclosed herein. In FIG. 15, the same reference numerals are allocated to the same or corresponding configuration elements to the configuration elements of the electrostatic protection circuit 10A according to the second exemplary embodiment (see FIG. 5), and duplicate explanation will be thereof omitted. In FIG. 15, the protected circuit 50 (see FIG. 1) is omitted from illustration. The electrostatic protection circuit 10C according to the fourth exemplary embodiment differs from the electrostatic protection circuit 10A according to the second exemplary embodiment in further including a P-MOS transistor 24 between the power source line VDE and the N-MOS transistors 21, 22. Namely, the source of the P-MOS transistor 24 is connected to the power source line VDE, and the drain and the gate of the P-MOS transistor 24 are connected to the drain of the N-MOS transistor 21 and the source of the N-MOS transistor 22.

In the electrostatic protection circuit 10C, a specific voltage (for example, 3.3V) is applied between the ground voltage line VSS and the power source line VDE during normal operation. The P-MOS transistor 24 and the N-MOS transistor 21 thereby adopt an ON state, and the voltage of the power source line VDE (3.3V) is applied to the gate of the N-MOS transistor 11 through the P-MOS transistor 24 and the N-MOS transistor 21. More precisely, the magnitude of the gate voltage $V_{GATE}$ of the N-MOS transistor 11 is the result of the threshold value voltage Vth of the N-MOS transistor 21 being subtracted from the voltage of the power source line VDE (3.3V). The N-MOS transistor 11 accordingly adopts an ON state. The N-MOS transistor 12, however, maintains an OFF state. Thus, similarly to in the electrostatic protection circuit 10 according to the first exemplary embodiment, tolerant functionality is exhibited that permits a voltage of magnitude exceeding the permissible voltage of the N-MOS transistors 11, 12 to be input to the external input terminal 13.

In the electrostatic protection circuit 10C, when a successive pulse signal (AC signal) is input to the external input terminal 13 during normal operation, the gate voltage $V_{GATE}$ of the N-MOS transistor 11 rises. When the gate voltage $V_{GATE}$ of the N-MOS transistor 11 becomes greater than the voltage of the power source line VDE, the N-MOS transistor 22 and the parasitic diode 25 of the P-MOS transistor 24 adopt an ON state. A discharge path is thereby formed between the gate of the N-MOS transistor 11 and the power source line VDE for charge charged to the gate of the N-MOS transistor 11. This thereby enables the gate voltage $V_{GATE}$ of the N-MOS transistor 11 that has risen according to input of the successive pulse signal (AC signal) to the external input terminal 13 to fall. Thus when a successive pulse signal (AC signal) is input to the external input terminal 13, the gate voltage $V_{GATE}$ of the N-MOS transistor 11 can be prevented from maintaining a state exceeding the permissible voltage, as in the electrostatic protection circuit 100B according to the second comparative example.

The operation in the electrostatic protection circuit 10C when a ESD surge is applied to the external input terminal 13 is similar to that in the electrostatic protection circuit 10A according to the second exemplary embodiment. Namely, the N-MOS transistor 22 is maintained in the OFF state during ESD surge application, and the gate voltage $V_{GATE}$ of the N-MOS transistor 11 that has risen according to application of the ESD surge to the external input terminal 13 is maintained without falling. This thereby enables discharge performance in response to ESD surge to be improved compared to in the electrostatic protection circuit 10 according to the first exemplary embodiment.

Similarly to in the electrostatic protection circuit 10B, in the electrostatic protection circuit 10C, due to insertion of the P-MOS transistor 24, surge current is suppressed from flowing in the parasitic diode of the N-MOS transistors 21, 22 during ESD surge application between VSS and VDE. This thereby enables a higher ability to withstand ESD surge applied between the ground voltage line VSS and the power source line VDE to be achieved than that of the electrostatic protection circuit 10A according to the second exemplary embodiment.

The electrostatic protection circuits 10, 10A, 10B, 10C correspond to the electrostatic protection circuit of technology disclosed herein. The integrated circuit 60 corresponds to an integrated circuit of technology disclosed herein. The protected circuit 50 corresponds to the protected circuit of technology disclosed herein. The N-MOS transistor 11 corresponds to the first transistor of technology disclosed herein. The N-MOS transistor 12 corresponds to the second transistor of technology disclosed herein. The N-MOS transistor 21 corresponds to the third transistor of technology disclosed herein. The N-MOS transistor 22 corresponds to the fourth transistor of technology disclosed herein. The P-MOS transistor 24 corresponds to a fifth transistor of technology disclosed herein. The external input terminal 13 corresponds to the external terminal of technology disclosed herein. The power source line VDE corresponds to the power source line of technology disclosed herein. The buffer circuit 23 corresponds to the buffer circuit of technology disclosed herein.

The technology disclosed herein exhibits the advantageous effect in an electrostatic protection circuit of suppressing the gate voltage of a high potential side transistor from rising according to input of a successive pulse signal to an external terminal, while achieving improved discharge performance to ESD surge applied to the external terminal.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electrostatic protection circuit, comprising:
   a first transistor connected to an external terminal;
   a second transistor that is connected in series to the first transistor and that is normally in an OFF state;
   a third transistor that is connected between a power source line and a gate of the first transistor; and
   a fourth transistor that is connected between the power source line and the gate of the first transistor in a direction opposite to a direction of the third transistor.

2. The electrostatic protection circuit of claim 1, wherein:
   the third transistor adopts an ON state when a specific voltage is supplied to the power source line, and applies the voltage of the power source line to the gate of the first transistor; and
   the fourth transistor draws charge from the gate of the first transistor to the power source line by adopting an ON state.

3. The electrostatic protection circuit of claim 1, wherein the fourth transistor adopts the ON state when the gate voltage of the first transistor is higher than the voltage of the power source line.

4. The electrostatic protection circuit of claim 1, further comprising a buffer circuit that includes an input terminal connected to the power source line, and that outputs, from an output terminal, an output voltage corresponding to the voltage supplied to a power source terminal when a specific voltage is supplied to the power source line, wherein the fourth transistor adopts an ON state in accordance with the output voltage of the buffer circuit.

5. The electrostatic protection circuit of claim 1, further comprising a fifth transistor that is connected between the power source line and the third and fourth transistors, that adopts an ON state together with the third transistor and applies the voltage of the power source line to the gate of the first transistor through the third transistor when a specific voltage is supplied to the power source line, and that includes a parasitic diode, the parasitic diode including an anode connected to the third transistor and the fourth transistor and a cathode connected to the power source line.

6. The electrostatic protection circuit of claim 3, wherein:
   the third transistor is an N-MOS transistor including a drain and a gate connected to the power source line, and including a source connected to the gate of the first transistor; and
   the fourth transistor is an N-MOS transistor including a source connected to the power source line, and including a drain and a gate connected to the gate of the first transistor.

7. The electrostatic protection circuit of claim 4, wherein:
   the third transistor is an N-MOS transistor including a drain and a gate connected to the power source line, and including a source connected to the gate of the first transistor; and
   the fourth transistor is an N-MOS transistor including a source connected to the power source line, a drain connected to the gate of the first transistor, and a gate connected to the output terminal of the buffer circuit.

8. The electrostatic protection circuit of claim 3, further comprising a fifth transistor that is a P-MOS transistor including a source connected to the power source line and including a drain and a gate connected to the third transistor and the fourth transistor, and that includes a parasitic diode, the parasitic diode including an anode connected to the third transistor and the fourth transistor and a cathode connected to the power source line, wherein:
- the third transistor is an N-MOS transistor including a gate connected to the power source line, a drain connected to the drain and the gate of the fifth transistor, and a source connected to the gate of the first transistor; and
- the fourth transistor is an N-MOS transistor including a source connected to the drain and the gate of the fifth transistor, and a drain and a gate connected to the gate of the first transistor.

9. The electrostatic protection circuit of claim 4, further comprising a fifth transistor that is a P-MOS transistor including a source connected to the power source line and including a drain and a gate connected to the third transistor and the fourth transistor, and that includes a parasitic diode having an anode connected to the third transistor and the fourth transistor and a cathode connected to the power source line, wherein:
- the third transistor is an N-MOS transistor including a gate connected to the power source line, a drain connected to the drain and the gate of the fifth transistor, and a source connected to the gate of the first transistor; and
- the fourth transistor is an N-MOS transistor including a source connected to the drain and the gate of the fifth transistor, a drain connected to the gate of the first transistor, and a gate connected to the output terminal of the buffer circuit.

10. The electrostatic protection circuit of claim 8, wherein the anode of the parasitic diode is configured including a drain region of the fifth transistor, and the cathode of the parasitic diode is configured including a well region of the fifth transistor.

11. The electrostatic protection circuit of claim 4, wherein the power source terminal of the buffer circuit is connected to the gate of the first transistor.

12. An integrated circuit, comprising:
an electrostatic protection circuit; and
a protected circuit that is protected, by the electrostatic protection circuit, from static electricity applied to an external terminal, wherein the electrostatic protection circuit includes:
- a first transistor connected to the external terminal;
- a second transistor that is connected in series to the first transistor and that is normally in an OFF state;
- a third transistor that is connected between a power source line and a gate of the first transistor; and
- a fourth transistor that is connected between the power source line and the gate of the first transistor in a direction opposite to a direction of the third transistor.

13. The integrated circuit of claim 12, wherein:
the third transistor adopts an ON state and applies the voltage of the power source line to the gate of the first transistor when a specific voltage is supplied to the power source line; and
the fourth transistor draws charge from the gate of the first transistor to the power source line by adopting an ON state.

14. The integrated circuit of claim 12, wherein the fourth transistor adopts the ON state when the gate voltage of the first transistor is higher than the voltage of the power source line.

15. The integrated circuit of claim 12, further comprising a buffer circuit that includes an input terminal connected to the power source line, and that outputs, from an output terminal, an output voltage corresponding to the voltage supplied to a power source terminal when a specific voltage is supplied to the power source line, wherein the fourth transistor adopts an ON state in accordance with the output voltage of the buffer circuit.

16. The integrated circuit of claim 12, further comprising a fifth transistor that is connected between the power source line and the third and fourth transistors, that adopts an ON state together with the third transistor and applies the voltage of the power source line to the gate of the first transistor through the third transistor when a specific voltage is supplied to the power source line, and that includes a parasitic diode, the parasitic diode including an anode connected to the third transistor and the fourth transistor and a cathode connected to the power source line.

17. The integrated circuit of claim 14, wherein:
- the third transistor is an N-MOS transistor including a drain and a gate connected to the power source line, and including a source connected to the gate of the first transistor; and
- the fourth transistor is an N-MOS transistor including a source connected to the power source line, and including a drain and a gate connected to the gate of the first transistor.

18. The integrated circuit of claim 15, wherein:
- the third transistor is an N-MOS transistor including a drain and a gate connected to the power source line, and including a source connected to the gate of the first transistor; and
- the fourth transistor is an N-MOS transistor including a source connected to the power source line, a drain connected to the gate of the first transistor, and a gate connected to the output terminal of the buffer circuit.

19. The integrated circuit of claim 14, further comprising a fifth transistor that is a P-MOS transistor including a source connected to the power source line and including a drain and a gate connected to the third transistor and the fourth transistor, and that includes a parasitic diode, the parasitic diode including an anode connected to the third transistor and the fourth transistor and a cathode connected to the power source line, wherein:
- the third transistor is an N-MOS transistor including a gate connected to the power source line, a drain connected to the drain and the gate of the fifth transistor, and a source connected to the gate of the first transistor; and
- the fourth transistor is an N-MOS transistor including a source connected to the drain and the gate of the fifth transistor, and a drain and a gate connected to the gate of the first transistor.

20. The integrated circuit of claim 15, further comprising a fifth transistor that is a P-MOS transistor including a source connected to the power source line and including a drain and a gate connected to the third transistor and the fourth transistor, and that includes a parasitic diode, the parasitic diode including an anode connected to the third transistor and the fourth transistor and a cathode connected to the power source line, wherein:
the third transistor is an N-MOS transistor including a gate connected to the power source line, a drain connected to the drain and the gate of the fifth transistor, and a source connected to the gate of the first transistor; and the fourth transistor is an N-MOS transistor including a source connected to the drain and the gate of the fifth transistor, a drain connected to the gate of the first transistor, and a gate connected to the output terminal of the buffer circuit.

\* \* \* \* \*